(12) United States Patent
Shichijo et al.

(10) Patent No.: US 9,780,258 B2
(45) Date of Patent: Oct. 3, 2017

(54) LIGHT EMITTING DEVICE

(71) Applicant: NICHIA CORPORATION, Anan-shi, Tokushima (JP)

(72) Inventors: Satoshi Shichijo, Itano-gun (JP); Kunihito Sugimoto, Anan (JP); Kenji Ozeki, Tokushima (JP); Shogo Abe, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/216,321

(22) Filed: Jul. 21, 2016

(65) Prior Publication Data

US 2017/0025572 A1    Jan. 26, 2017

(30) Foreign Application Priority Data

Jul. 23, 2015    (JP) .................. 2015-145788

(51) Int. Cl.
*H01L 33/20* (2010.01)
*H01L 33/60* (2010.01)
*H01L 33/50* (2010.01)

(52) U.S. Cl.
CPC ............ *H01L 33/20* (2013.01); *H01L 33/505* (2013.01); *H01L 33/60* (2013.01); *H01L 2933/0041* (2013.01); *H01L 2933/0058* (2013.01)

(58) Field of Classification Search
CPC ....... H01L 33/20; H01L 33/60; H01L 33/505; H01L 2933/0058; H01L 2933/0041
See application file for complete search history.

(56) References Cited

U.S. PATENT DOCUMENTS

| | | | |
|---|---|---|---|
| 8,896,199 B2* | 11/2014 | Ito | ............ H01L 33/505 313/502 |
| 2011/0235355 A1 | 9/2011 | Seko | |
| 2012/0104452 A1 | 5/2012 | Miyoshi et al. | |
| 2012/0211774 A1 | 8/2012 | Harada | |
| 2014/0131753 A1 | 5/2014 | Ishida et al. | |
| 2015/0102366 A1 | 4/2015 | Wada | |

(Continued)

FOREIGN PATENT DOCUMENTS

| | | |
|---|---|---|
| JP | 2009-218274 A | 9/2009 |
| JP | 2010-219324 A | 9/2010 |
| JP | 2011-134829 A | 7/2011 |

(Continued)

*Primary Examiner* — Dung Le
(74) *Attorney, Agent, or Firm* — Foley & Lardner LLP

(57) ABSTRACT

A light emitting device includes a base member; a light emitting element mounted on the base member; a light-transmissive member that covers an upper surface of the light emitting element, and is substantially rectangular in a plan view; and a light reflecting member that covers a lateral surface of the light-transmissive member, the light reflecting member having a substantially rectangular frame shape in a plan view. A width of the light reflecting member is smaller along a short side of the light-transmissive member than along a long side of the light-transmissive member. A height of the light reflecting member is smaller along the short side of the light-transmissive member than along the long side of the light-transmissive member at a position separated from an outer edge of the light reflecting member by a predetermined distance.

10 Claims, 23 Drawing Sheets

(56) References Cited

U.S. PATENT DOCUMENTS

2015/0204494 A1* 7/2015 Wada ................. H01L 25/0753
 313/498
2015/0263254 A1 9/2015 Miyoshi et al.

FOREIGN PATENT DOCUMENTS

| | | |
|---|---|---|
| JP | 2011-204376 A | 10/2011 |
| JP | 2012-079840 A | 4/2012 |
| JP | 2012-099544 A | 5/2012 |
| JP | 2012-099545 A | 5/2012 |
| JP | 2012-169442 A | 9/2012 |
| JP | 2014-096605 A | 5/2014 |
| JP | 2014-112635 A | 6/2014 |
| JP | 2015-079805 A | 4/2015 |
| JP | 2015-188069 A | 10/2015 |
| JP | 2015-201657 A | 11/2015 |

* cited by examiner

LIGHT EMITTING DEVICE

CROSS-REFERENCE TO RELATED APPLICATION

This application claims priority to Japanese Patent Application No. 2015-145788, filed on Jul. 23, 2015, the disclosure of which is hereby incorporated by reference in its entirety.

BACKGROUND

1. Technical Field

The present disclosure relates to a light emitting device and a method of manufacturing the same.

2. Description of Related Art

Semiconductor light emitting elements such as light emitting diodes (LEDs) and laser diodes (LDs) are used as various kinds of light sources. Particularly in recent years, as illumination light sources replacing fluorescent lamps, light emitting diodes are receiving attention as next-generation lighting, due to their small power consumption and long life. Still, further improvements in light emission output and in light emission efficiency are needed for the light emitting diodes. For example in the field of light sources including vehicular headlights and projector lighting, there is also a need for light sources that exhibit high luminance and have a particular light distribution, e.g., a hemispherical light distribution called Lambertian. There has been proposed a light emitting device in which lateral surfaces of a light emitting element are covered with a light reflecting member for the purpose of attaining high front luminance. Light emitting devices are required to maintain their performance over a long period of use, particularly in interior and exterior illumination of vehicular applications.

As such, a light emitting device has been described in which lateral surfaces of a light emitting element is covered with a light reflecting member. For example, Japanese Unexamined Patent Application Publication No. 2009-218274 discloses a semiconductor light emitting device that includes: a light emitting element; a wavelength conversion layer positioned on or above the light emitting element; a reflecting member disposed adjacent to a lateral surface of the wavelength conversion layer and to a lateral surface of the light emitting element, the lateral surface of the light emitting element being positioned on an identical surface side to the lateral surface of the wavelength conversion layer; and a base member on which the light emitting element and the reflecting member are mounted. The light emitting device has a structure in which the lateral surface of the wavelength conversion layer (e.g., a light-transmissive member) and the lateral surface of the light emitting element are covered with the reflecting member (e.g., a light reflecting member) formed to surround the wavelength conversion layer.

Further, Japanese Unexamined Patent Application Publication No. 2012-79840 discloses a light emitting device that includes: a base member; at least one light emitting element mounted on the base member; a resin layer disposed on the light emitting element; a plate-like member mounted on the resin layer; and a reflecting resin member provided to surround the resin layer and the plate-like member. The reflecting resin member covers the entire lateral surface of the plate-like member. The light emitting device has a structure in which the lateral surface of the resin layer (i.e., the light-transmissive member) and the lateral surface of the plate-like member are covered with the reflecting resin member (i.e., the light reflecting member) formed to surround the resin layer.

With the light emitting devices disclosed in Japanese Unexamined Patent Application Publication No. 2009-218274 and 2012-79840, the reflecting member at the lateral surface of the light emitting element may deteriorate over a long period of use.

SUMMARY

An objective of an embodiment of the present disclosure is to provide a light emitting device including a light reflecting member less susceptible to deterioration and a method of manufacturing the same.

A light emitting device according to an embodiment of the present disclosure includes: a base member; a light emitting element mounted on the base member; a light-transmissive member that covers an upper surface of the light emitting element and is substantially rectangular in a plan view; and a light reflecting member that covers a lateral surface of the light-transmissive member and has a substantially rectangular frame shape in a plan view. A width of the light reflecting member is smaller along a short side of the light-transmissive member than along a long side of the light-transmissive member. A height of the light reflecting member is smaller along the short side of the light-transmissive member than along the long side of the light-transmissive member at a position separated from an outer edge of the light reflecting member by a predetermined distance.

A light emitting device according to an embodiment of the present disclosure includes: a base member; a light emitting element mounted on the base member; a light-transmissive member that covers an upper surface of the light emitting element and is substantially rectangular in a plan view; and a light reflecting member that includes a frame body formed to surround the light-transmissive member and a filling member provided between the frame body and the light-transmissive member to cover a lateral surface of the light-transmissive member, the light reflecting member having a substantially rectangular frame shape in a plan view. In the light emitting device, a width of the light reflecting member is smaller along a short side of the light-transmissive member than along a long side of the light-transmissive member, and a height of the frame body is smaller along the short side of the light-transmissive member than along the long side of the light-transmissive member.

A method of manufacturing a light emitting device according to an embodiment of the present disclosure includes: forming a light-transmissive member being substantially rectangular in a plan view to cover an upper surface of a light emitting element mounted on a base member; and forming a light reflecting member in a substantially rectangular frame shape in a plan view, the forming the light reflecting member including forming the frame body to surround the light-transmissive member and forming a filling member between the frame body and the light-transmissive member to cover a lateral surface of the light-transmissive member. In the forming the light reflecting member, the light reflecting member is formed such that a width of the light reflecting member is smaller along a short side of the light-transmissive member than along a long side of the light-transmissive member, and in the forming the frame body, the frame body is formed such that a height of the frame body is smaller along the short side of the light-transmissive member than along the long side of the light-transmissive member.

With the light emitting device according to the embodiment of the present disclosure, the light reflecting member is less susceptible to deterioration. Further, with the method of manufacturing a light emitting device according to the embodiment of the present disclosure, a light emitting device including a light reflecting member less susceptible to deterioration can be manufactured.

DETAILED DESCRIPTION

Figure 1:
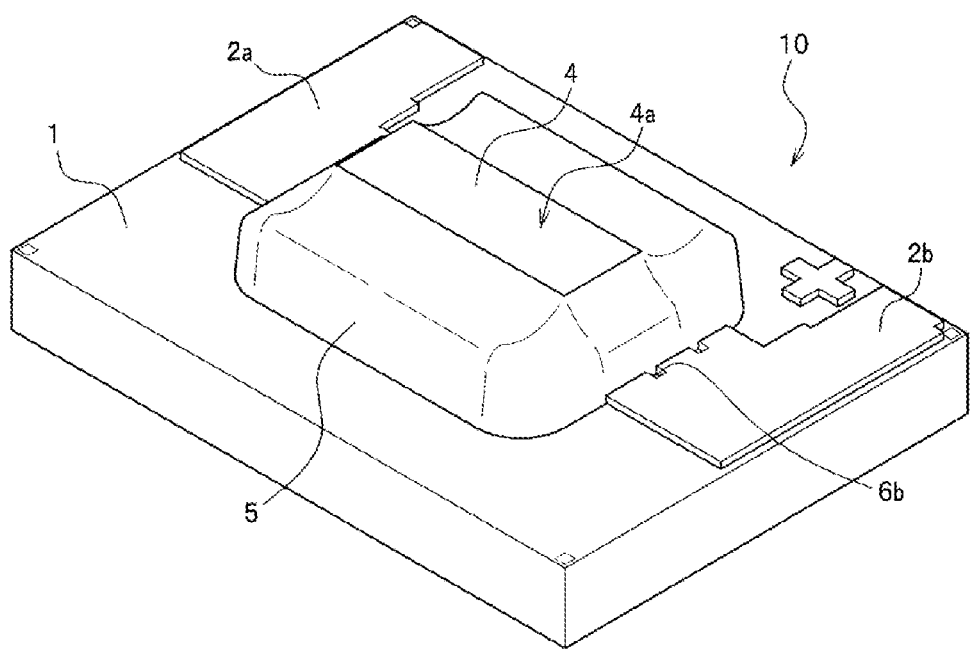
FIG. 1 is a perspective view schematically showing the structure of a light emitting device according to an embodiment.

In the following, a description will be given of an embodiment with reference to the drawings. Note that, the following embodiment is merely an illustration of a light emitting device for embodying the technical idea of the present embodiment, and is not intended to be limiting. Further, the size, material, shape, relative disposition and the like of members described in the embodiment are merely illustrative and not intended to limit the scope of the present invention thereto unless otherwise specified. The size, positional relationship and the like of members shown in the drawings may be exaggerated for the sake of clarity.

Further, in a light emitting device according to the embodiment, "upper/top", "lower/bottom", "right", "left" and the like are replaced by one another depending on the situation. In the present specification, "upper/top", "lower/bottom", and the like refer to the relative position among members in the drawings referred to for description, and are not intended to specify the absolute position unless otherwise specified.

(Light Emitting Device)

First, a description will be given of a light emitting device according to the present embodiment.

Figure 2:
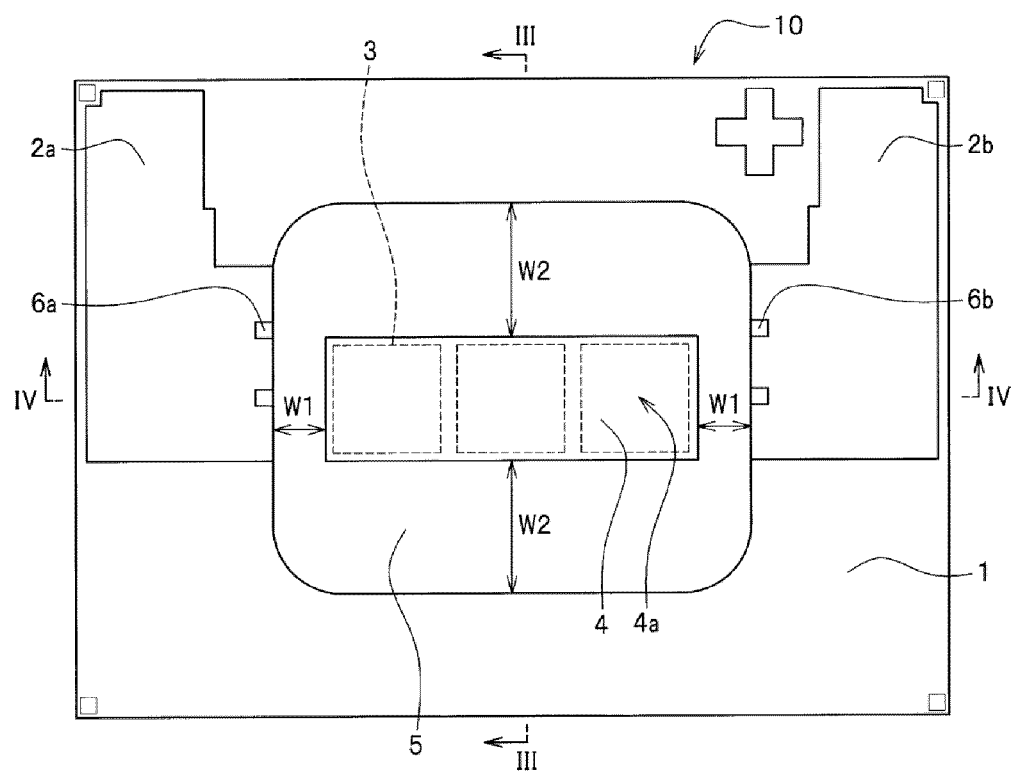
FIG. 2 is a plan view schematically showing the structure of the light emitting device according to the embodiment.
Figure 3:
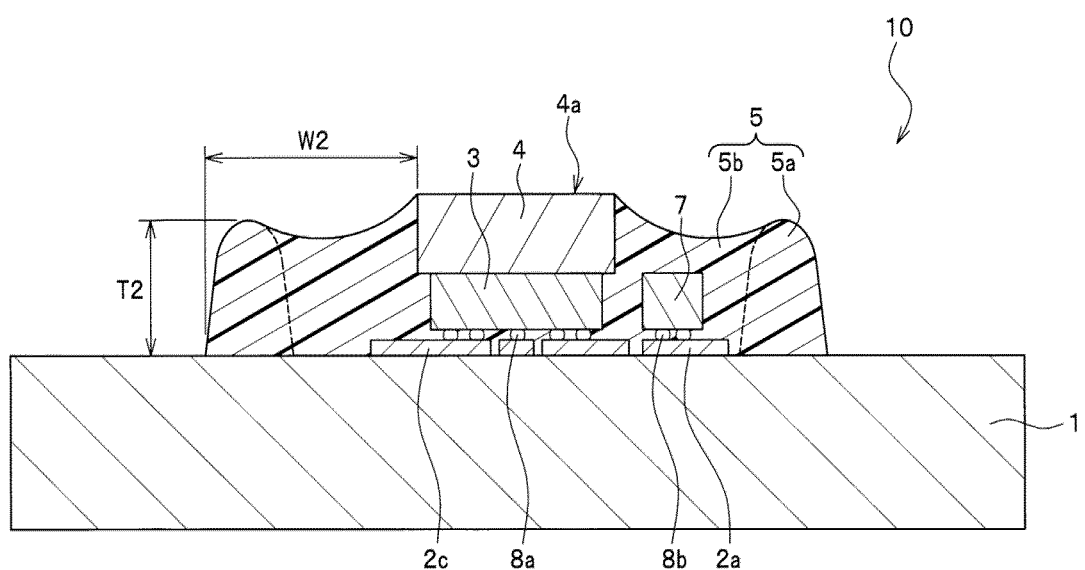
FIG. 3 is a cross-sectional view schematically showing the structure of the light emitting device according to the embodiment, showing a cross section taken along line in FIG. 2.
Figure 4:
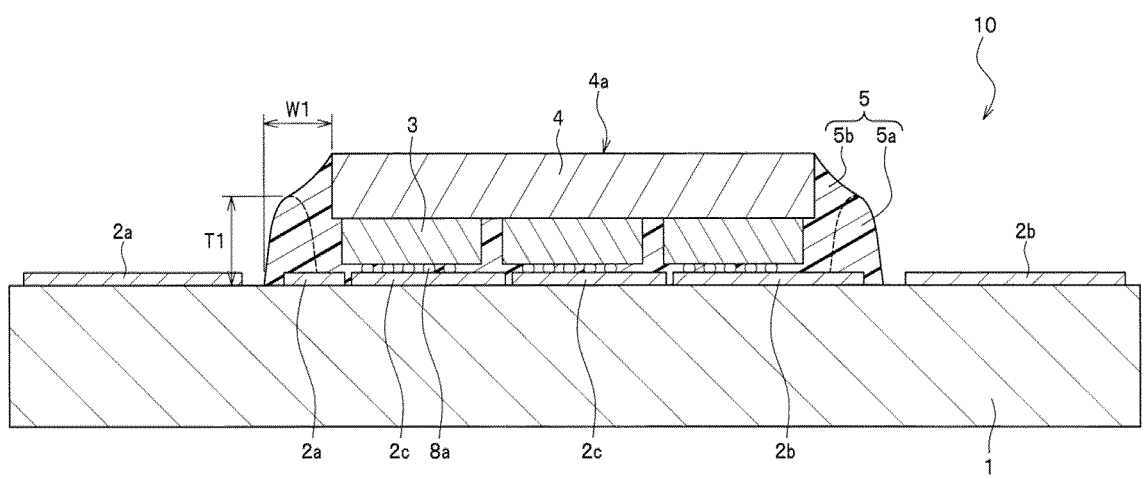
FIG. 4 is a cross-sectional view schematically showing the structure of the light emitting device according to the embodiment, showing a cross section taken along line IV-IV in FIG. 2.

FIG. 1 is a perspective view schematically showing the structure of the light emitting device according to the embodiment. FIG. 2 is a plan view schematically showing the structure of the light emitting device according to the embodiment. FIG. 3 is a cross-sectional view schematically showing the structure of the light emitting device according to the embodiment, showing a cross section taken along line in FIG. 2. FIG. 4 is a cross-sectional view schematically showing the structure of the light emitting device according to the embodiment, showing a cross section taken along line IV-IV in FIG. 2.

A frame body 5a and a filling member 5b, which are actually integrated as shown in FIG. 2, are shown in FIGS. 3 and 4 with a broken line between them for the sake of convenience, so that the boundary between the frame body 5a and filling member 5b can be recognized. The same holds true for FIGS. 10B and 10C which will be referred to later.

The light emitting device 10 mainly includes a base member 1, electrically conductive patterns 2a, 2b, and 2c, light emitting elements 3, a light-transmissive member 4, and a light reflecting member 5.

(Base Member)

The base member 1 may be made of an insulating member such as glass epoxy, resin, or ceramic, or alternatively the base member 1 may be a metal member provided with an insulating film at its surface. In particular, the base member 1 is preferably made of ceramic, which is highly heat-resistant and environment-resistant. Exemplary ceramic materials include alumina, aluminum nitride, mullite and the like.

(Electrically Conductive Patterns)

At the surface of the base member 1, the electrically conductive patterns 2a and 2b being a pair of positive and negative electrodes are provided. The electrically conductive patterns 2a and 2b are respectively provided with through holes 6a and 6b where the base member 1 is exposed. The electrically conductive relaying patterns 2c are provided between the electrically conductive patterns 2a and 2b in order to relaying thereof (see FIG. 5A). The through holes 6a and 6b each have an elongated shape extending in a direction along the long side of the light-transmissive member 4. That is, the through holes 6a and 6b in the present embodiment each have an elongated shape in the longitudinal direction of the base member 1, and are partially covered with the light reflecting member 5. In the through holes 6a and 6b, the surface of the base member 1 and the light reflecting member 5 are in contact with each other.

The electrically conductive patterns 2a, 2b, and 2c may be formed by metal such as copper, aluminum, gold, silver, platinum, titanium, tungsten, palladium, iron, and nickel, or alloy containing any of the foregoing metals, but the material for forming the electrically conductive patterns 2a, 2b, and 2c is not limited thereto. Further, the uppermost surfaces of the electrically conductive patterns 2a, 2b, and 2c formed at the upper surface of the base member 1 are preferably covered with a material exhibiting high reflectivity such as silver or gold, in order for light from the light emitting elements 3 to be efficiently extracted. Such electrically conductive patterns 2a, 2b, and 2c can be formed by electroplating, electroless plating, vapor deposition, sputtering and the like. For example, when Au bumps are used for mounting the light emitting elements 3, employing Au for the uppermost surfaces of the electrically conductive patterns 2a, 2b, and 2c improves joining.

By having the electrically conductive patterns 2a and 2b, the heat releasing property of the light emitting device 10 improves. Also, by virtue of the electrically conductive patterns 2a and 2b having the through holes 6a and 6b, adhesion between the light reflecting member 5 and the base member 1 improves because the light reflecting member 5 is in contact with the base member 1 at the sites of the electrically conductive patterns 2a and 2b. Further, the shape of the through holes 6a and 6b being elongated in the extending direction of the electrically conductive patterns aids current to smoothly flow through the electrically conductive patterns 2a and 2b, and increases the adhesion area between the base member 1 and the light reflecting member 5.

(Light Emitting Elements)

In the present embodiment, three light emitting elements 3 are mounted on the base member 1. In the present embodiment, the light emitting elements 3 each have a pair of positive and negative electrodes on an identical surface. The pairs of electrodes are flip-chip mounted on the electrically conductive patterns 2a, 2b, and 2c on the surface of the base member 1 via bumps 8a made of Au or the like. The upper surfaces of the light emitting elements 3, which are opposite to the lower surfaces provided with the electrodes, are the main light output surfaces.

The light emitting elements 3 are preferably light emitting diodes. The light emitting elements 3 may be of any wavelength. For example, the material of blue, green-color light emitting elements 3 may be a ZnSe or nitride-based semiconductor ($In_XAl_YGa_{1-X-Y}N$, $0 \leq X$, $0 \leq Y$, $X+Y<1$), or GaP. Further, the material of red light emitting elements 3 may be GaAlAs, AlInGaP or the like. Still further, semiconductor light emitting elements made of other materials may be used. The composition, emission light color, size, number and the like of the light emitting elements 3 may be selected as appropriate depending on the intended use.

The light emitting elements 3 are, for example, each obtained by having a nitride semiconductor layer stacked on a light-transmissive sapphire substrate for crystal growth. The sapphire substrate is the upper surface of each light emitting element 3, and serves as the main light output surface. Note that, the growth substrate may be removed, for example, by polishing, LLO (Laser Lift Off) and the like. Such a growth substrate is not limited to a sapphire substrate, and can be changed as appropriate. For example, a GaN substrate may be employed.

(Light-Transmissive Member)

The light-transmissive member 4 is a member that covers the upper surfaces of the light emitting elements 3. In the present embodiment, the light-transmissive member 4 has a plate-like, and provided on the upper surfaces of the three light emitting elements 3. The light-transmissive member 4 is formed to be substantially rectangular in a plan view. Further, in the present embodiment, the plate-like light-transmissive member 4 is provided on the upper surfaces of the light emitting elements 3, and therefore the lateral surfaces of the light emitting elements 3 are not covered with the light-transmissive member 4 at the periphery of the light-transmissive member 4.

The light-transmissive member 4 has a lower surface where the light from the light emitting elements 3 is input and an upper surface (i.e., light emitting surface 4a) where the light from the light emitting elements 3 is output. The light-transmissive member 4 has a plate-like shape, with which the light reflecting member 5 covering lateral surfaces of the light-transmissive member 4 hinders to creeps up onto the upper surface of the light transmissive member 4. The upper surface and lower surface of the light-transmissive member 4 are flat surfaces being substantially parallel to each other.

The light-transmissive member 4 is made of a material capable of transmitting light having been emitted from the light emitting elements 3 to the outside, and may contain a light diffusing member or a fluorescent material that is capable of converting the wavelength of at least part of the input light. Specifically, for example, the light-transmissive member 4 may be a cut piece of a fluorescent material ingot such as a single crystal or polycrystalline fluorescent material or a sintered body of fluorescent material powder, or may be a sintered component of a mixture of fluorescent material powder and resin, glass, an inorganic material or the like. While the thickness of the light-transmissive member 4 is not particularly limited and can be changed as appropriate, an exemplary thickness is about 50 μm to 300 μm.

The fluorescent material contained in the light-transmissive member 4 should be capable of being excited by light emitted from the light emitting elements 3. For example, a fluorescent material that can be excited by a blue-color light emitting element or an ultraviolet light emitting element may be: a cerium-activated yttrium-aluminum-garnet-based fluorescent material (Ce:YAG); a cerium-activated lutetium-aluminum-garnet-based fluorescent material (Ce:LAG); an europium and/or chromium-activated nitrogen-containing calcium aluminosilicate based fluorescent material (CaO—$Al_2O_3$—$SiO_2$); an europium-activated silicate-based fluorescent material (($Sr,Ba)_2SiO_4$); a nitride-based fluorescent material such as a β-sialon fluorescent material, a CASN-based fluorescent material, and a SCASN-based fluorescent material; a KSF-based fluorescent material ($K_2SiF_6$:Mn); a sulfide-based fluorescent material, a quantum dot fluorescent material and the like. By combining the fluorescent materials and a blue-color light emitting element or an ultraviolet light emitting element, many colors and color temperatures can be realized. For example, in certain embodiments of the present invention, light emitting devices can be manufactured to emit light of various colors, including, for instance, white-color-based light. To obtain the light emitting device 10 that emits white-color light, the type and concentration of the fluorescent material contained in the light-transmissive member 4 are adjusted to render white color. The concentration of the fluorescent material is, for example, in a range of about 5% by mass to about 50% by mass.

The exemplary light diffusing members that can be contained in the light-transmissive member 4 include titanium oxide, barium titanate, aluminum oxide, silicon oxide and the like.

(Light Reflecting Member)

The light reflecting member 5 is formed to surround the light-transmissive member 4, and has a substantially rectangular frame shape in a plan view. In the present embodiment, the light reflecting member 5 covers the lateral surfaces of the light-transmissive member 4 and the lateral surfaces of the light emitting elements 3 not covered with the light-transmissive member 4.

The width of the light reflecting member 5 is smaller along the short side of the light-transmissive member 4 than along the long side of the light-transmissive member 4. Here, the short side of the light-transmissive member 4 refers to both the right and left sides in FIG. 2, and the long side of the light-transmissive member 4 refers to both the top and bottom sides in FIG. 2.

Further, the width of the light reflecting member 5 refers to the distance from the outer edge (side) of the light-transmissive member 4 to the outer edge (side) of the light reflecting member 5 that is adjacent to that outer edge (side) of the light-transmissive member 4 in a plan view. That is, the light reflecting member 5 is shaped such that, in FIG. 2, a distance W1 from the left side of the light-transmissive member 4 to the left side of the light reflecting member 5, and a distance W1 from the right side of the light-transmissive member 4 to the right side of the light reflecting member 5 are smaller than a distance W2 from the upper side of the light-transmissive member 4 to the upper side of the light reflecting member 5, and a distance W2 from the lower side of the light-transmissive member 4 to the lower side of the light reflecting member 5.

In general, a light reflecting member made of resin is prone to deteriorate during a long period of use of the light emitting device. For example, cracks may occur. Accordingly, the light emitting device preferably contains the light reflecting member by a reduced amount. However, when the width of the light reflecting member is uniformly narrowed over the entire perimeter of the light reflecting member for the purpose of reducing the amount of the light reflecting member, the adhesion area between the light reflecting member and the base member is reduced. Then, the light reflecting member may be easily separated from the base member by the stress applied between the light reflecting member and the base member.

In the present embodiment, setting the width W1 of the light reflecting member 5 to be smaller than the width W2 reduces the amount of the resin constituting the light reflecting member 5, and the light reflecting member 5 is less likely to deteriorate. Further, it also suppresses occurrence of separation at the interface between the light reflecting member 5 and the base member 1, the interface between the light reflecting member 5 and the light-transmissive member 4, and the interface between the light reflecting member 5 and the members nearby. Thus, the light emitting device 10 possesses improved long-period thermal shock resistance.

Further, at a position separated from the outer edge of the light reflecting member 5 by a predetermined distance, the height of the light reflecting member 5 is smaller along the short side of the light-transmissive member 4 than along the long side of the light-transmissive member 4. Here, the position separated from the outer edge of the light reflecting member 5 by a predetermined distance is, for example, the center position in the width of the frame body 5a, which extends perpendicularly from the outer edge of the light reflecting member 5. That is, it may be the position where the height of the frame body 5a is at the maximum.

The light reflecting member 5 is made up of the frame body 5a and the filling member 5b. In the present embodiment, the frame body 5a and the filling member 5b integrally form the light reflecting member 5. Here, being integral refers to the state where, at the boundary of the frame body 5a and the filling member 5b, the light reflecting material (resin) of the frame body 5a and the light reflecting material (resin) of the filling member 5b so closely attach to each other that the boundary is hardly recognizable.

The frame body 5a is formed to surround the light-transmissive member 4. In the present embodiment, the frame body 5a is formed to be rectangular frame shape in a plan view, having its short sides paralleled to the short sides of the light-transmissive member 4 and its long sides paralleled to the long sides of the light-transmissive member 4.

The filling member 5b is provided between the frame body 5a and the light-transmissive member 4, and between the frame body 5a and the light emitting elements 3. The filling member 5b covers the lateral surfaces of the light-transmissive member 4 and the lateral surfaces of the light emitting elements 3.

The height of the frame body 5a is smaller along the short side of the light-transmissive member 4 than along the long side of the light-transmissive member 4. Here, the height of the frame body 5a refers to the distance from the upper surface of the base member 1 to the upper end (uppermost surface) of the frame body 5a. That is, as shown in FIGS. 3 and 4, the light reflecting member 5 is formed such that, a distance T1 from the base member 1 to the upper end of the frame body 5a along the short side of the light-transmissive member 4 is smaller than a distance T2 from the base member 1 to the upper end of the frame body 5a along the long side of the light-transmissive member 4.

Setting the height of the frame body 5a as above moderates creeping up of the filling member 5b onto the light emitting surface 4a along the short side of the light-transmissive member 4 during manufacture of the light emitting device 10. Accordingly, the light emitting surface 4a will not be covered with the light reflecting member 5. Provided that the light emitting surface 4a is covered with the light reflecting member 5, the covered amount would be very small. Thus, high quality of the light emitting device 10 is obtained.

Further, the width of the frame body 5a is smaller along the short side of the light-transmissive member 4 than along the long side of the light-transmissive member 4.

An exemplary size of the light reflecting member 5 is as follows. When the light-transmissive member 4 has a short side measuring in a range of 950 μm to 1350 μm and a long side measuring in a range of 3000 μm to 6000 μm in a plan view, the width W1 of the light reflecting member 5 along the short side of the light-transmissive member 4 is in a range of 400 μm to 600 μm, and the width W2 of the light reflecting member 5 along the long side of the light-transmissive member 4 is in a range of 1000 μm to 1200 μm. Further, the difference between the width W2 of the light reflecting member 5 along the long side of the light-transmissive member 4 and the width W1 of the light reflecting member 5 along the short side of the light-transmissive member 4 is in a range of 400 μm to 600 μm. The width W1 of the light reflecting member 5 along the short side of the light-transmissive member 4 is smaller than the width W2 of the light reflecting member 5 along the long side of the light-transmissive member 4.

When the height from the upper surface of the base member 1 to the upper surface of the light-transmissive member 4 is 350 μm, the height T1 of the frame body 5a along the short side of the light-transmissive member 4 is in a range of 150 μm to 300 μm, and preferably 210 μm; and the height T2 of the frame body 5a along the long side of the light-transmissive member 4 is in a range of 200 μm to 350 μm, and preferably 280 μm. Further, the difference between the height T2 of the frame body 5a along the long side of the light-transmissive member 4 and the height T1 of the frame body 5a along the short side of the light-transmissive member 4 is in a range of 50 μm to 200 μm. The height T1 of the frame body 5a along the short side of the light-transmissive member 4 is smaller than the height T2 of the frame body 5a along the long side of the light-transmissive member 4. Further, in the present embodiment, the height T1 of the frame body 5a along the short side of the light-transmissive member 4 is higher than the height from the upper surface of the base member 1 to the upper surfaces of the light emitting elements 3, and the height T2 of the frame body 5a along the long side of the light-transmissive member 4 is smaller than the height from the upper surface of the base member 1 to the upper surface of the light-transmissive member 4.

Further, as to the size of the frame body 5a, in a plan view, the width of the frame body along the short side of the light-transmissive member 4 is in a range of 200 μm to 400 μm, and preferably in a range of 250 μm to 300 μm. The width of the frame body 5a along the long side of the light-transmissive member 4 is in a range of 300 μm to 600 μm, and preferably in a range of 350 μm to 450 μm. The width of the frame body 5a along the short side of the light-transmissive member 4 is smaller than the width of the frame body 5a along the long side of the light-transmissive member 4.

The height of the upper surface (upper end) of the filling member 5b is preferably equal to or smaller than the height of the upper surface of the light-transmissive member 4. That is, the height from the base member 1 to the upper surface of the filling member 5b is equal to or smaller than the maximum height from the base member 1 to the upper surface of the light-transmissive member 4. The light output from the light emitting surface 4a spreads sideways also. When the upper surface of the light reflecting member 5 is higher than the height of the light emitting surface 4a, light output from the light emitting surface 4a is reflected by the light reflecting member 5, resulting in variations in light distribution. Accordingly, while the lateral surfaces of the light-transmissive member 4 are covered with the light reflecting member 5, a reduction in the height of the light reflecting member 5 covering the outer perimeter of the lateral surfaces allow the output light to be directly extracted outside, and thus is preferable.

In the present embodiment, as shown in FIG. 3, the filling member 5b is slightly recessed in a cross-sectional view taken in the short side direction of the light-transmissive member 4. Thus, the light reflecting member 5 is slightly recessed. The light reflecting member 5 is formed such that the minimum height from the base member 1 to the upper surface of the filling member 5b is smaller than the maximum height of the frame body 5a. In order to improve the front luminance of the light emitting device 10, the upper surface of the light reflecting member 5 along the long side of the light-transmissive member 4 is preferably flush with the upper surface of the light-transmissive member 4. However, when the light reflecting member 5 is flush with the light-transmissive member 4, the light reflecting member 5 may disadvantageously become higher than the light emitting surface 4a due to thermal expansion of resin. Further, when the light reflecting member 5 is deeply recessed, light may be disadvantageously leak from the lateral surfaces of the light emitting device 10. Accordingly, in the present embodiment, the light reflecting member 5 along the long side of the light-transmissive member 4 is slightly recessed in a cross-sectional view in the width direction. Being slightly recessed specifically means that the height from the upper surface of the base member 1 to the deepest portion of the recess is equal to or greater than the height of the frame body 5a along the short side of the light-transmissive member 4.

The light reflecting member 5 may be formed by a base material, which contains a light reflecting substance. The base material may be resin such as silicone resin, modified silicone resin, epoxy resin, modified epoxy resin, and acrylic resin, or hybrid resin containing at least one type of the foregoing resins. The material of the light reflecting substance may be oxide containing one of Ti, Zr, Nb, Al, or Si, or AlN, MgF, BN or the like. Preferably, titanium oxide (TiO$_2$) is employed. Preferably, as the light reflecting substance, particles of which the refractive index is different from that of the base material are dispersed in the base material. The amount of light reflected or transmitted by the light reflecting member 5 varies depending on the content and concentration of the light reflecting substance. Accordingly, the content and concentration of the light reflecting substance should be adjusted as appropriate in accordance with the shape or size of the light emitting device 10. Per 100 parts by weight of resin, the light reflecting substance is preferably contained by 20 parts by weight to 60 parts by weight, and particularly preferably contained by 25 parts by weight to 35 parts by weight.

The frame body 5a and the filling member 5b are respectively made of high viscosity of a light reflecting material (i.e., resin) and low viscosity of a light reflecting material (i.e., resin). For the materials, the above materials of the light reflecting member 5 can be used. The viscosity of the frame body 5a is preferably in a range of 200 Pa·s to 800 Pa·s, and further preferably in a range of 350 Pa·s to 450 Pa·s. The viscosity of the filling member 5b is preferably 40 Pa·s or less, and more preferably 4 in a range of Pa·s to 8 Pa·s.

The light reflecting material of the frame body 5a and the light reflecting material of the filling member 5b may be the same or different from each other.

(Others)

In the present embodiment, on the base member 1, a protective element 7 such as a Zener diode or the like embedded in the light reflecting member 5 is provided via bumps 8b.

<Operation of Light Emitting Device>

Next, a description will be given of the operation of the light emitting device.

In activating the light emitting device 10, current is supplied from the an external power supply to the light emitting elements 3 via the electrically conductive patterns 2a, 2b, and 2c, and the light emitting elements 3 emit light. The light emitted from the light emitting elements 3 is reflected by the light reflecting member 5 at the interface between the light emitting elements 3 and the light reflecting member 5, and at the interface between the light-transmissive member 4 and the light reflecting member 5, into the light emitting elements 3 and the light-transmissive member 4. In this manner, the light propagates through the light emitting elements 3 and the light-transmissive member 4, and ultimately extracted to the outside from the light emitting surface 4a of the light-transmissive member 4.

<Method of Manufacturing Light Emitting Device>

Next, a description will be given of a method of manufacturing the light emitting device according to the present embodiment.

Figure 5A:
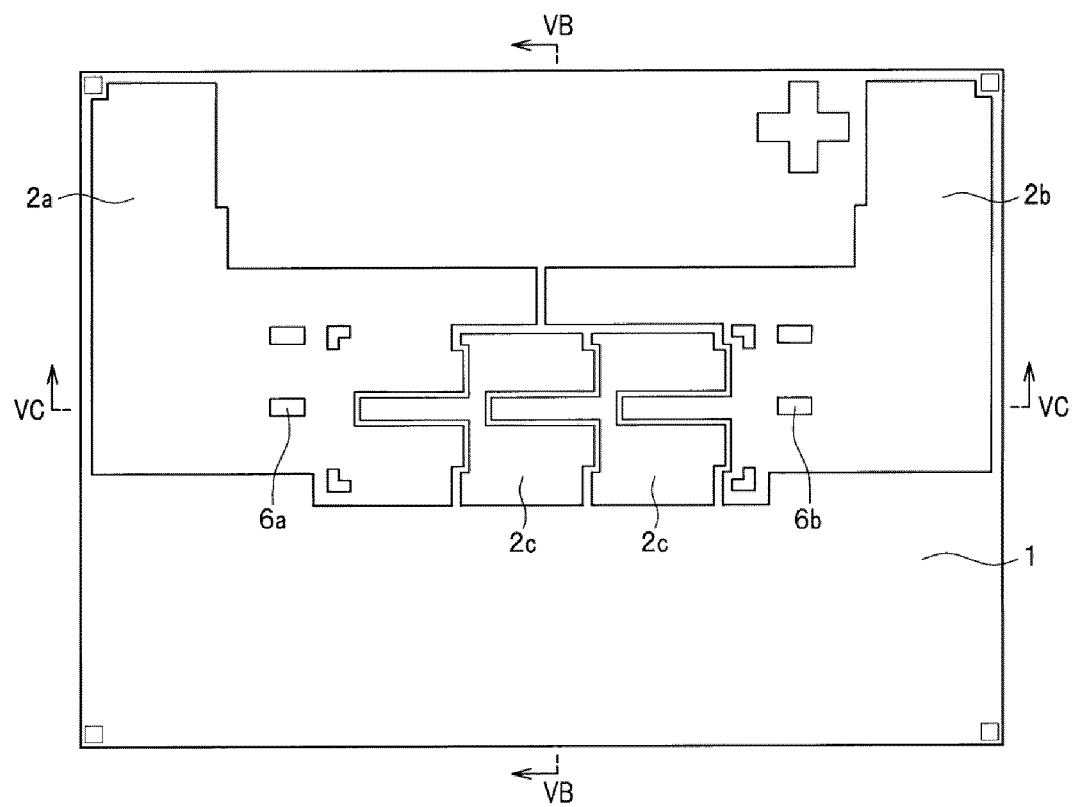
FIG. 5A is a plan view schematically showing a base member preparation step in a method of manufacturing the light emitting device according to the embodiment.
Figure 5B:
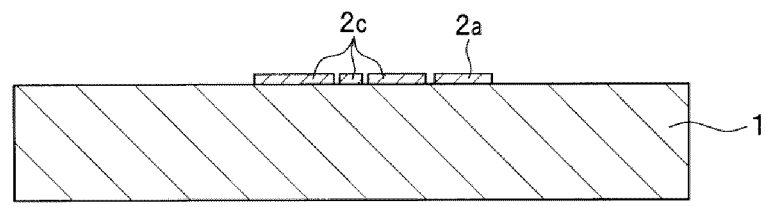
FIG. 5B is a cross-sectional view schematically showing the base member preparation step in the method of manufacturing the light emitting device according to the embodiment, showing a cross section taken along line VB-VB in FIG. 5A.
Figure 5C:
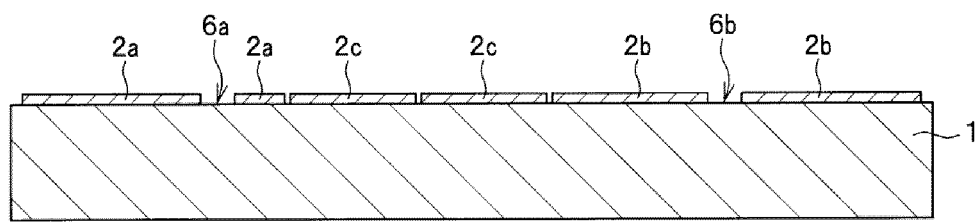
FIG. 5C is a cross-sectional view schematically showing the base member preparation step in the method of manufacturing the light emitting device according to the embodiment, showing a cross section taken along line VC-VC in FIG. 5A.
Figure 6A:
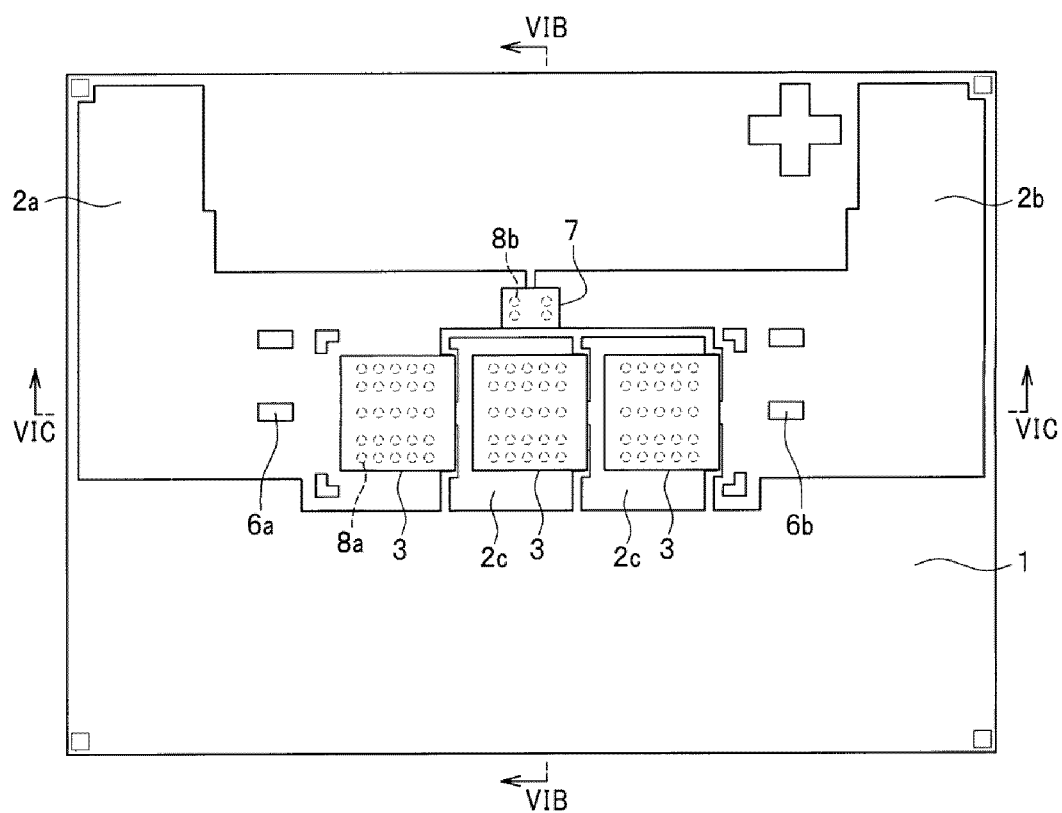
FIG. 6A is a plan view schematically showing a light emitting elements mounting step in the method of manufacturing the light emitting device according to the embodiment.
Figure 6B:
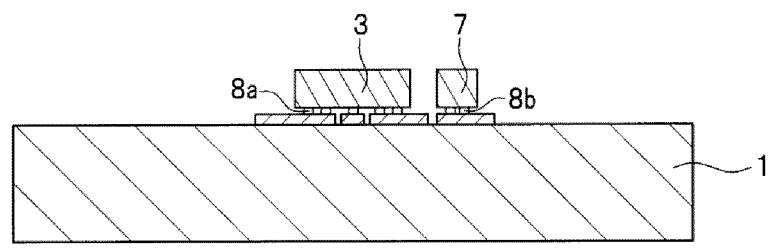
FIG. 6B is a cross-sectional view schematically showing the light emitting elements mounting step in the method of manufacturing the light emitting device according to the embodiment, showing a cross section taken along line VIB-VIB in FIG. 6A.
Figure 6C:
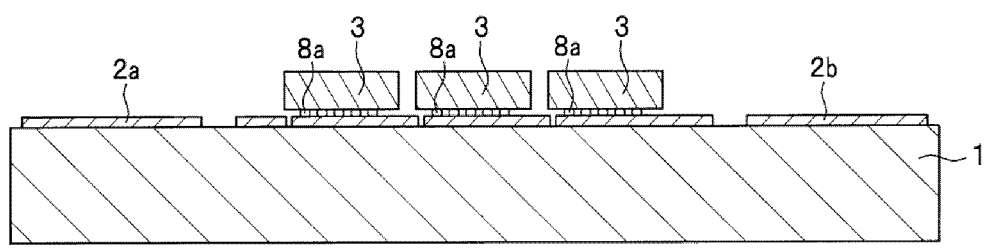
FIG. 6C is a cross-sectional view schematically showing the light emitting elements mounting step in the method of manufacturing the light emitting device according to the embodiment, showing a cross section taken along line VIC-VIC in FIG. 6A.
Figure 7A:
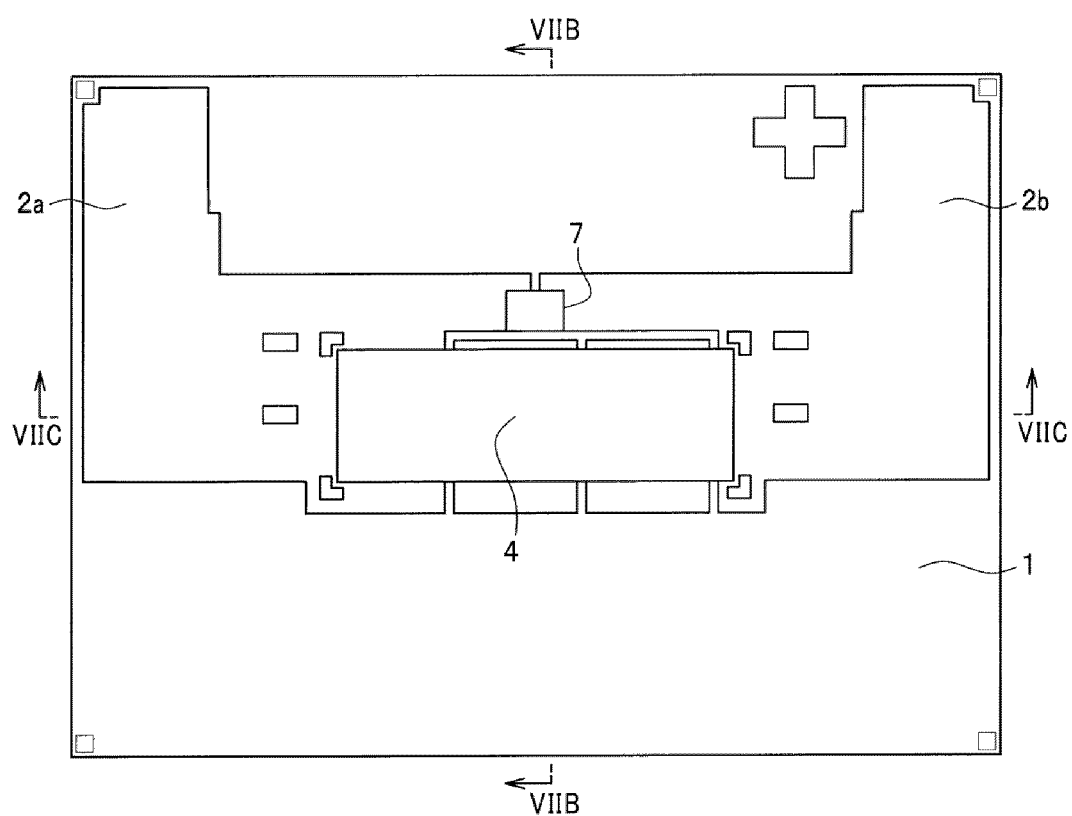
FIG. 7A is a plan view schematically showing a light-transmissive member forming step in the method of manufacturing the light emitting device according to the embodiment.
Figure 7B:
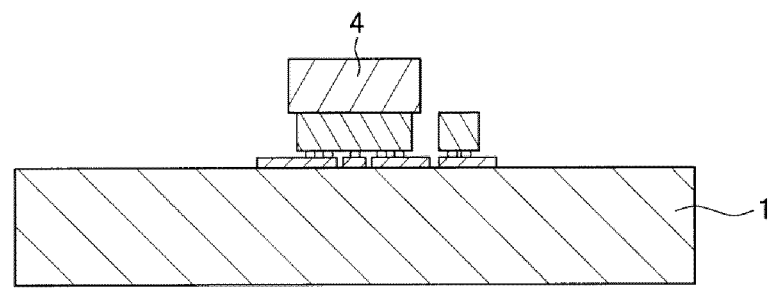
FIG. 7B is a cross-sectional view schematically showing the light-transmissive member forming step in the method of manufacturing the light emitting device according to the embodiment, showing a cross section taken along line VIIB-VIIB in FIG. 7A.
Figure 7C:
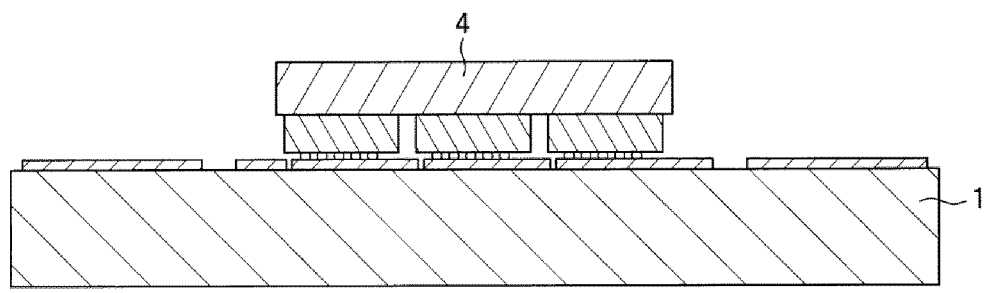
FIG. 7C is a cross-sectional view schematically showing the light-transmissive member forming step in the method of manufacturing the light emitting device according to the embodiment, showing a cross section taken along line VIIC-VIIC in FIG. 7A.
Figure 8A:
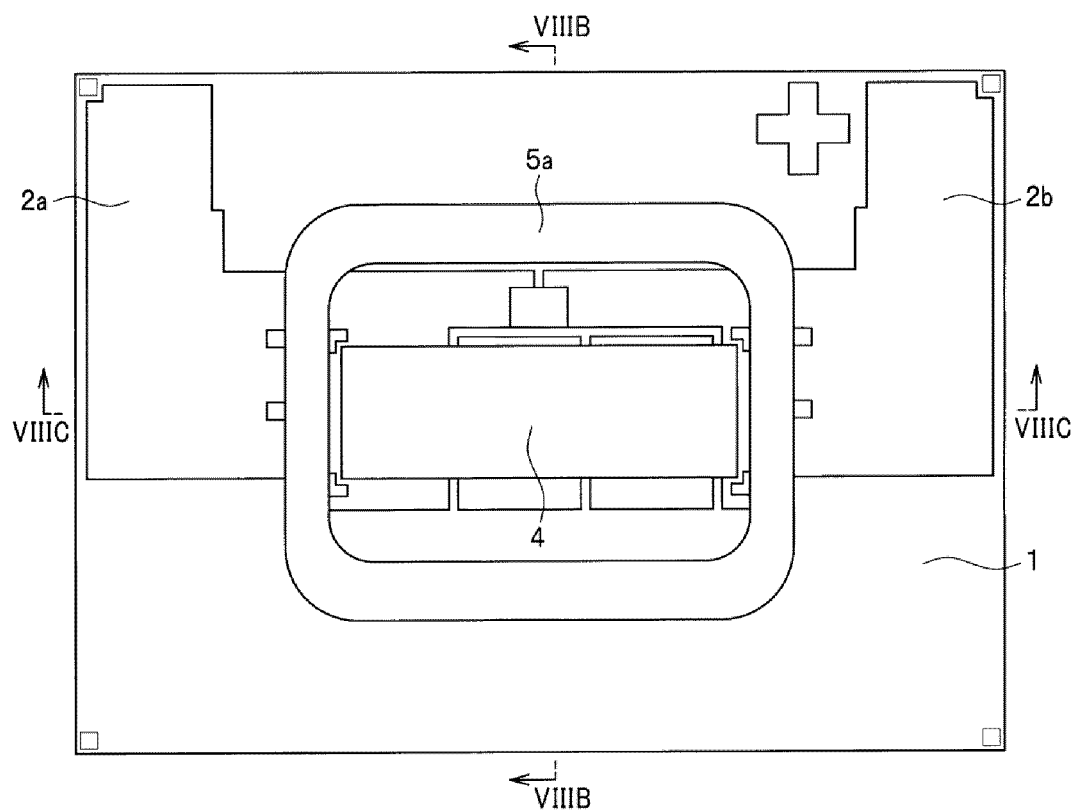
FIG. 8A is a plan view schematically showing a frame body forming step in the method of manufacturing the light emitting device according to the embodiment.
Figure 8B:
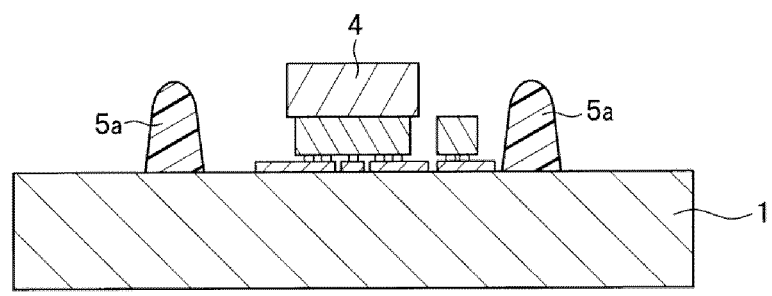
FIG. 8B is a cross-sectional view schematically showing the frame body forming step in the method of manufacturing the light emitting device according to the embodiment, showing a cross section taken along line VIIIB-VIIIB in FIG. 8A.
Figure 8C:
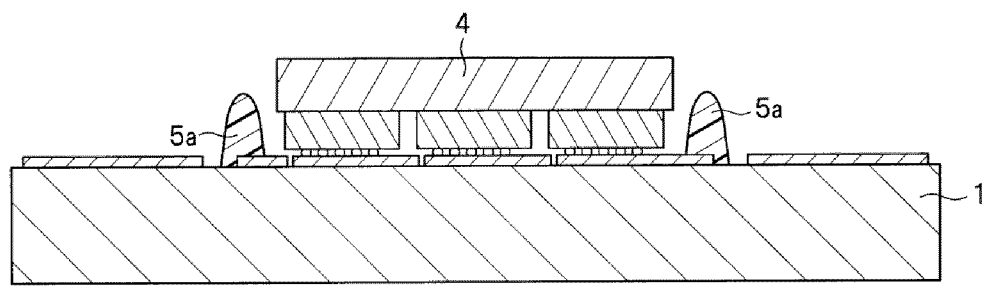
FIG. 8C is a cross-sectional view schematically showing the frame body forming step in the method of manufacturing the light emitting device according to the embodiment, showing a cross section taken along line VIIIC-VIIIC in FIG. 8A.
Figure 9A:
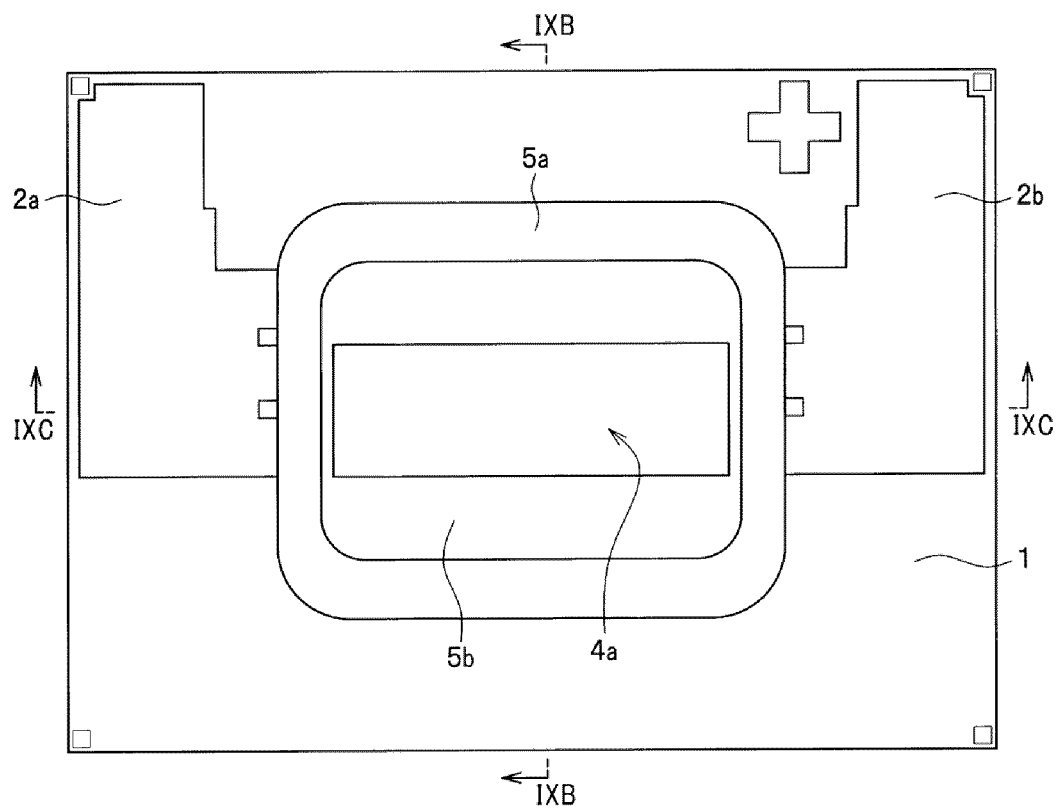
FIG. 9A is a plan view schematically showing a filling member forming step in the method of manufacturing the light emitting device according to the embodiment.
Figure 9B:
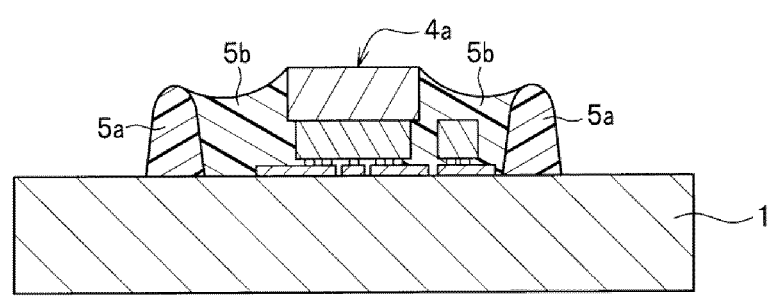
FIG. 9B is a cross-sectional view schematically showing the filling member forming step in the method of manufacturing the light emitting device according to the embodiment, showing a cross section taken along line IXB-IXB in FIG. 9A.
Figure 9C:
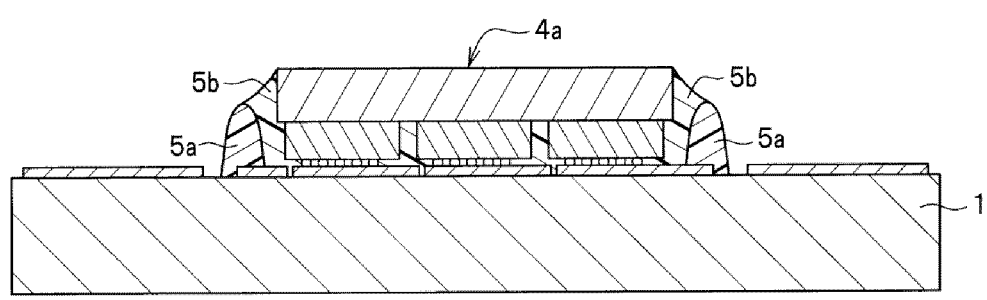
FIG. 9C is a cross-sectional view schematically showing the filling member forming step in the method of manufacturing the light emitting device according to the embodiment, showing a cross section taken along line IXC-IXC in FIG. 9A.
Figure 10A:
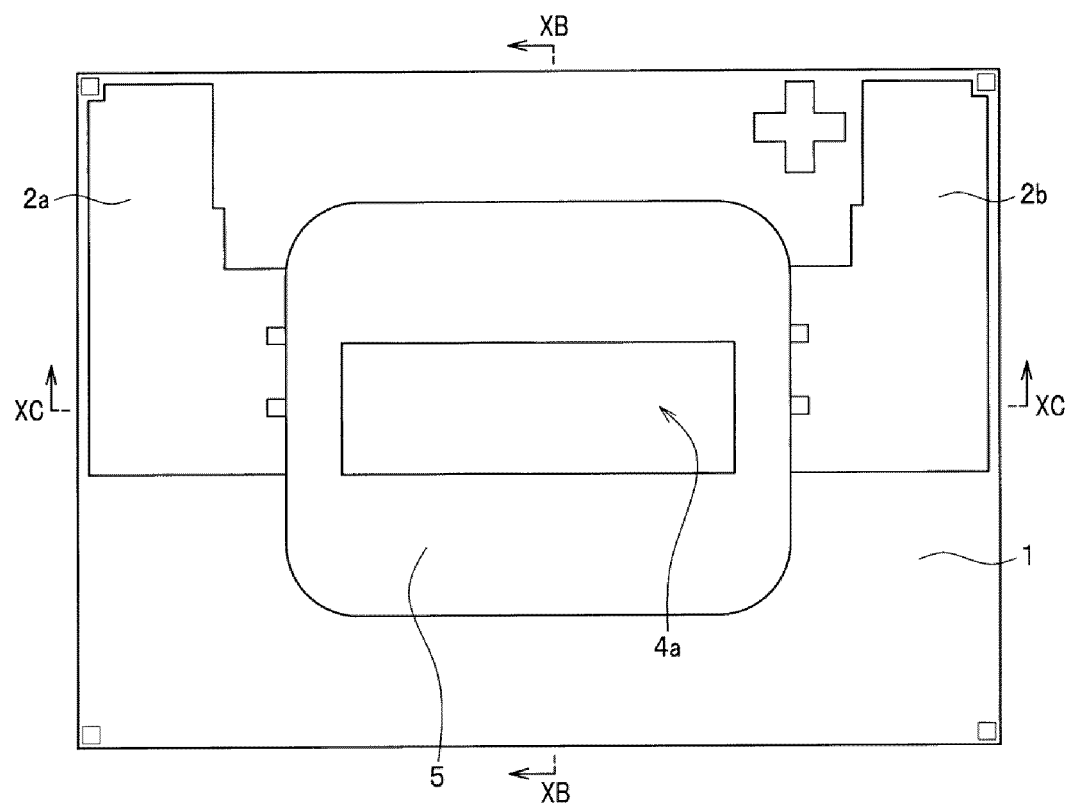
FIG. 10A is a plan view schematically showing a light reflecting material curing step in the method of manufacturing the light emitting device according to the embodiment.
Figure 10B:
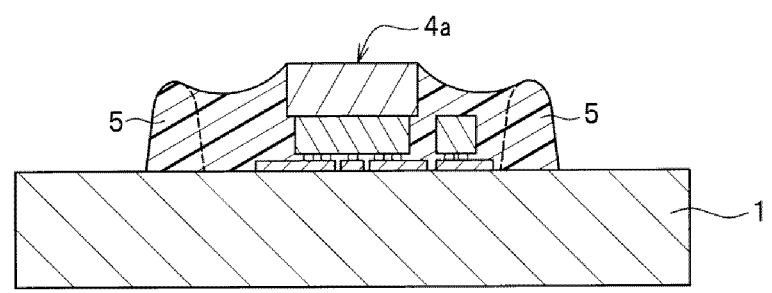
FIG. 10B is a cross-sectional view schematically showing the light reflecting material curing step in the method of manufacturing the light emitting device according to the embodiment, showing a cross section taken along line XB-XB in FIG. 10A.
Figure 10C:
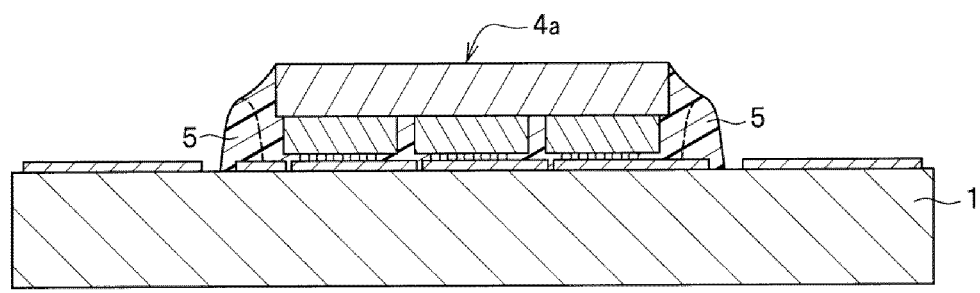
FIG. 10C is a cross-sectional view schematically showing the light reflecting material curing step in the method of manufacturing the light emitting device according to the embodiment, showing a cross section taken along line XC-XC in FIG. 10A.

FIGS. 5A, 5B, and 5C are diagrams schematically showing preparing a base member in the method of manufacturing the light emitting device according to the embodiment. FIGS. 6A, 6B, and 6C are diagrams schematically showing mounting light emitting elements in the method of manufacturing the light emitting device according to the embodiment. FIGS. 7A, 7B, and 7C are diagrams schematically showing forming a light-transmissive member in the method of manufacturing the light emitting device according to the embodiment. FIGS. 8A, 8B, and 8C are diagrams schematically showing forming a frame body in the method of manufacturing the light emitting device according to the embodiment. FIGS. 9A, 9B, and 9C are diagrams schematically showing forming a filling member in the method of manufacturing the light emitting device according to the embodiment. FIGS. 10A, 10B, and 10C are diagrams schematically showing curing a light reflecting material in the method of manufacturing the light emitting device according to the embodiment.

FIGS. 5A, 6A, 7A, 8A, 9A, and 10A are plan views. FIGS. 5B, 6B, 7B, 8B, 9B, and 10B are respectively a cross-sectional view taken along line VB-VB in FIG. 5A, a cross-sectional view taken along line VIB-VIB in FIG. 6A, a cross-sectional view taken along line VIIB-VIIB in FIG. 7A, a cross-sectional view taken along line VIIIB-VIIIB in FIG. 8A, a cross-sectional view taken along line IXB-IXB in FIG. 9A, and a cross-sectional view taken along line XB-XB in FIG. 10A. FIGS. 5C, 6C, 7C, 8C, 9C, and 10C are respectively a cross-sectional view taken along line VC-VC in FIG. 5A, a cross-sectional view taken along line VIC-VIC in FIG. 6A, a cross-sectional view taken along line VIIC-VIIC in FIG. 7A, a cross-sectional view taken along line VIIIC-VIIIC in FIG. 8A, a cross-sectional view taken along line IXC-IXC in FIG. 9A, and a cross-sectional view taken along line XC-XC in FIG. 10A.

Figure 11:
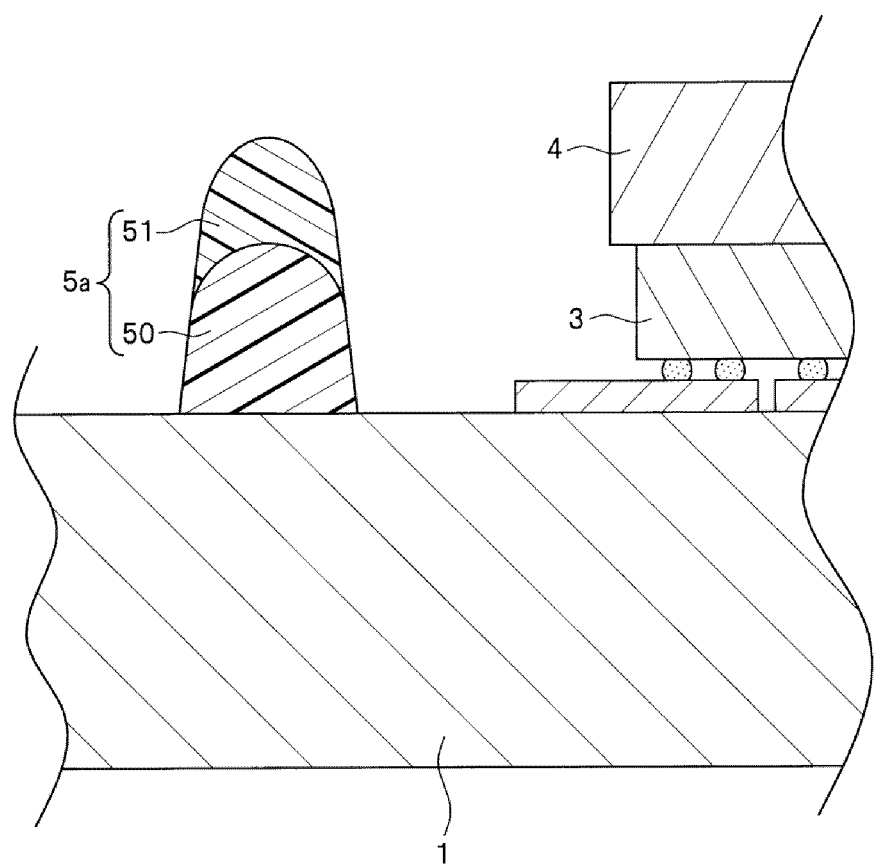
FIG. 11 is a schematic cross-sectional view for illustrating a method of forming the frame body in two stages in the step of forming the frame body of the light emitting device according to the embodiment, being an enlarged partial cross-sectional view taken along line VIIIB-VIIIB in FIG. 8A.

FIG. 11 is a schematic cross-sectional view for describing a method of forming the frame body in two stages in the forming the frame body of the light emitting device according to the embodiment, being an enlarged partial cross-sectional view taken along line VIIIB-VIIIB in FIG. 8A.

The method of manufacturing the light emitting device 10 of the present embodiment includes, as an example, preparing a base member, mounting light emitting elements, forming a light-transmissive member, forming a light reflecting member, and curing a light reflecting material, which are performed in order. Further, in the present embodiment, the forming the light reflecting member includes forming a frame body, disposing an underfill material, and forming a filling member, which are performed in this order.

The materials, disposition and the like of the members are similar to those described above regarding the structure of the light emitting device 10, and therefore the description thereof will be omitted as appropriate.

(Base Member Preparation Step)

The step of preparing a base member is an operation of preparing the base member 1 on which a pair of positive and negative electrically conductive patterns 2a and 2b, and the electrically conductive relaying patterns 2c are formed.

As shown in FIGS. 5A, 5B, and 5C, in the present embodiment, the electrically conductive pattern 2a being the cathode and the electrically conductive pattern 2b being the anode extend from the center of the base member 1 where the light emitting elements 3 are mounted toward the outer edge. Thus, external connection portions connected to an external power supply is structured. Further, the electrically conductive relaying patterns 2c are provided between the electrically conductive patterns 2a and 2b. Thus, the three light emitting elements 3 which are flip-chip mounted are connected in series. The electrically conductive patterns 2a, 2b, and 2c can be formed by electroplating, electroless plating, vapor deposition, sputtering and the like. The through holes 6a and 6b can be formed by, for example, disposing a predetermined mask pattern at the time of forming the electrically conductive patterns 2a and 2b.

(Light Emitting Elements Mounting Step)

The step of mounting a light emitting elements is an operation of mounting the light emitting elements 3 on the base member 1.

As shown in FIGS. 6A, 6B, and 6C, the light emitting elements 3 and the protective element 7 are flip-chip mounted on the electrically conductive patterns 2a, 2b, and 2c with the bumps 8a and 8b. The three light emitting elements 3 are disposed in line, and connected in series by the electrically conductive patterns 2a, 2b, and 2c on the base member 1 as described above. In the case where a plurality of light emitting elements 3 are mounted, preferably the light emitting elements 3 are aligned and mounted substantially rectangularly as a whole in a plan view.

(Light-Transmissive Member Forming Step)

The step of forming a light-transmissive member is an operation of covering the upper surfaces of the light emitting elements 3 which is mounted on the base member 1, with the light-transmissive member 4 in shaped of substantially rectangular in a plan view. In the present embodiment, the plate-like light-transmissive member 4 is provided at the upper surfaces of the light emitting elements 3, thereby forming the light-transmissive member 4 while avoiding the light-transmissive member 4 from covering the lateral surfaces of the light emitting elements 3 at the perimeter of the light-transmissive member 4.

As shown in FIGS. 7A, 7B, and 7C, the light-transmissive member 4 is bonded to the upper surfaces of the light emitting elements 3. The light emitting elements 3 and the light-transmissive member 4 can be firmly bonded to each other via an adhesive agent. The adhesive agent is preferably a material that can effectively guide the output light from the light emitting elements 3 toward the light-transmissive member 4 side, and can optically couple the light emitting elements 3 and the light-transmissive member 4 to each other. For example, a light-transmissive adhesive material such as silicone resin is employed.

When the light-transmissive member 4 and the light emitting elements 3 are firmly bonded to each other by an adhesive agent, particularly in the case where the light-transmissive member 4 is greater in size than the light emitting elements 3, the adhesive agent may be disposed to reach the lateral surfaces of the light emitting elements 3 so as to facilitate propagation of light from the light emitting elements 3 to the light-transmissive member 4. In this case, the adhesive agent is disposed between the lateral surfaces of the light emitting elements 3 and the light reflecting member 5. However, preferably the adhesive agent is not disposed outer than the area immediately under the light-transmissive member 4. Thus, the light is properly reflected and propagated between the light emitting elements 3 and the light reflecting member 5, and occurrence of color non-uniformity can be prevented. Further, the light emitting elements 3 and the light-transmissive member 4 can be firmly bonded to each other by direct bonding through compression bonding, sintering, surface-activated bonding, atomic diffusion bonding, and hydroxyl group bonding.

(Light Reflecting Member Forming Step)

The step of forming a light reflecting member is an operation of forming the light reflecting member 5 which has a substantially rectangular frame shape in a plan view. In the forming the light reflecting member, the light reflecting member 5 is formed such that the width of the light reflecting member 5 is smaller along the short side of the light-transmissive member 4 than along the long side of the light-transmissive member 4.

The forming the light reflecting member includes forming a frame body, disposing an underfill material, and forming a filling member.

[Frame Body Forming Step]

The step of forming a frame body is an operation of forming the frame body 5a to surround the light-transmissive member 4.

As shown in FIGS. 8A, 8B, and 8C, in the forming the frame body, the frame body 5a is formed such that the frame body 5a is nearer to the light-transmissive member 4 along the short side of the light-transmissive member 4 than along the long side of the light-transmissive member 4. That is, in FIG. 2, the frame body 5a is formed such that the distance W1 from the left side of the light-transmissive member 4 to the left side of the frame body 5a, and the distance W1 from the right side of the light-transmissive member 4 to the right side of the frame body 5a are smaller than the distance W2 from the upper side of the light-transmissive member 4 to the upper side of the frame body 5a, and the distance W2 from the lower side of the light-transmissive member 4 to the lower side of the frame body 5a.

Further, in the forming the frame body, the frame body 5a is formed such that the height of the frame body 5a is smaller along the short side of the light-transmissive member 4 than along the long side of the light-transmissive member 4. That is, as shown in FIGS. 3 and 4, the frame body 5a is formed such that the distance T1 from the base member 1 to the upper end of the frame body 5a along the short side of the light-transmissive member 4 is smaller than the distance T2 from the base member 1 to the upper end of the frame body 5a along the long side of the light-transmissive member 4.

After the space between the frame body 5a and the light-transmissive member 4 is filled with resin constituting the filling member 5b, resin depression takes place, that is, the resin is drawn toward the base member 1 side. While the resin depression is strong between the frame body 5a along the long side of the light-transmissive member 4 and the light-transmissive member 4, the resin depression is weak between the frame body 5a along the short side of the light-transmissive member 4 and the light-transmissive member 4 because of the small distance between them. Accordingly, when the height of the frame body 5a along the short side of the light-transmissive member 4 is similar to the height of the frame body 5a along the long side of the light-transmissive member 4, the resin may disadvantageously creep up onto the light emitting surface 4a along the short side of the light-transmissive member 4 when the space is filled with the resin. In contrast, as in the light emitting device 10 of the present embodiment, the frame body 5a can be formed such that the height T1 of the frame body 5a along the short side of the light-transmissive member 4 is smaller than the height T2 of the frame body 5a along the long side of the light-transmissive member 4. This makes the resin less likely to creep up onto the light emitting surface 4a.

Setting the height T1 of the frame body 5a to be smaller than the height T2 thereof helps the filling member 5b avoid creeping up onto the light emitting surface 4a and reduces the amount of the resin constituting the light reflecting member 5. Hence, the light reflecting member 5 is less susceptible to deterioration.

As shown in FIG. 11, in the forming the frame body, preferably the frame body 5a is formed by: forming a first frame body 50 by applying the light reflecting material (resin) to surround the light-transmissive member 4; and thereafter forming a second frame body 51 by further applying the light reflecting material (resin) on the first frame body 50. The light reflecting material is applied for two successive rounds to be overlaid in the height direction outside the perimeter of the light-transmissive member 4. Thus, the frame body 5a having a two-stage structure is formed. In this manner, the frame body 5a having a small width and a relatively great height can be obtained.

Depending on the viscosity of the resin of the frame body 5a, the resin is required by a greater amount in order to reliably obtain a desired height. This invites an increase in the width. In view of mass productivity of the light emitting device 10, in order to reliably obtain the desired height of the frame body 5a while reducing its width, the resin is preferably discharged for a plurality of successive rounds outside the perimeter of the light-transmissive member 4 to attain the desired height.

The frame body 5a made of resin having a two-stage structure can be formed by: applying resin constituting the first frame body 50; and thereafter, before curing the applied resin, applying resin constituting the second frame body 51 on the first frame body 50. Further, the frame body 5a made of resin having a two-stage structure can be formed by, for example: using a discharging apparatus as described below, applying resin of the first frame body 50; and successively to the applying, applying resin of the second frame body 51 on the first frame body 50 so as not to break discharge of the resin from the discharging apparatus in forming the first frame body 50 and the second frame body 51.

The frame body 5a can be formed by, for example, using a discharging apparatus (i.e., resin discharging apparatus) that can continuously discharge liquid resin by air pressure (see Japanese Unexamined Patent Application Publication No. 2009-182307).

In use of the discharging apparatus, the shifting speed of a needle of the discharging apparatus is set to be faster along the short side of the light-transmissive member 4 than along the long side of the light-transmissive member 4. Thus, while the discharge flow rate of resin discharged from the discharging apparatus is kept constant, the height of the frame body 5a can be set to be smaller along the short side of the light-transmissive member 4 than along the long side of the light-transmissive member 4. Further, changing the speed in this manner allows the width of the frame body 5a to be smaller along the short side of the light-transmissive member 4 than along the long side of the light-transmissive member 4, despite the diameter of the needle of the discharging apparatus being kept constant. By virtue of the reduced width of the frame body 5a along the short side of the light-transmissive member 4, the width of the light reflecting member 5 is reduced and a space between the light-transmissive member 4 and the frame body 5a is reliably obtained. This facilitates filling the space between the light-transmissive member 4 and the frame body 5a along the short side of the light-transmissive member 4 with resin.

For example, without being limited to adjusting the speed, adjusting the discharge flow rate enables forming the substantially rectangular frame body 5a of which height differs between along the long side of the light-transmissive member 4 and along the short side thereof. However, in forming the substantially rectangular frame body 5a, irrespective of the intention to change the height along each side, the shifting speed of the needle changes due to the needle changing the shifting direction around a corner of the rectangle. Accordingly, when it is desired to achieve different heights between along the long side and the short side by the discharge flow rate, a change in the speed due to a change in the shifting direction of the needle and switching of the discharge flow rate must be in synchronization with each other. Otherwise, the shape of the resin frame would not be stabilized. However, in the method of manufacturing the light emitting device 10 according to the present embodiment, needle shifting speed is switched at a timing when the speed is changed in association with change of the shifting direction. Thus, the frame body 5a having different heights can be formed with simple operations, which is suitable for volume production.

The frame body 5a is preferably formed such that the height along the long side of the light-transmissive member 4 is substantially equal to or smaller than the height of the upper surface of the light-transmissive member 4 serving as the light emitting surface 4a. Such forming enables use of creeping of resin, which structures the filling member 5b formed in the later step, and cause the resin to cover the lateral surfaces of the light emitting elements 3 and those of the light-transmissive member 4, while reducing the creeping up of the resin onto the upper surface of the light-transmissive member 4 and obstructing the light output. Further, making the frame body 5a greater in height requires an increased amount of resin and results in a greater width. In view of the foregoing also, preferably, the height of the frame body 5a is substantially equal to or smaller than the height of the upper surface of the light-transmissive member 4. Further, the height of the frame body 5a along the long side of the light-transmissive member 4 is raised enough to prevent the resin covering the lateral surfaces of the light emitting elements 3 and those of the light-transmissive member 4 from overflowing. Preferably, the height of the frame body 5a along the long side of the light-transmissive member 4 is half the height from the surface of the base member 1 or from the electrically conductive patterns 2a and 2b to the light emitting surface 4a or greater.

Further, increased viscosity of the frame body 5a can suppress an increase in the width while raising the height, and improves the dimensional precision. However, high viscosity of resin lowers the discharging speed and thus reduces productivity, and reduces adhesion between the frame body 5a and the base member. In particular, when the frame body 5a is formed using a discharging apparatus that discharges liquid resin, the frame is formed by overlaying the starting point of the discharged resin and the end point thereof. Here, high-viscosity resin may have disadvantageous effects that space is generated at the overlaid portion, or the adhesion strength of the discharged resin between the start point and the end point may varies. The viscosity of the frame body 5a may be just enough to provide, for example, the frame body 5a with a semicircular cross section, with its tail wetly spreading over the base member 1. For forming such a frame body, preferably resin of which viscosity is about 200 to 800 Pa s is employed for the frame body 5a.

[Underfill Material Disposing Step]

As in the present embodiment, when the light emitting elements 3 are flip-chip mounted on the electrically conductive patterns (e.g., metal plating) formed on the base member 1 via the electrically conductive members such as the bumps, preferably an underfill material is disposed in the space between the portion of the base member 1 where the light emitting elements 3 are mounted and the light emitting elements 3. The disposed underfill material can absorb the stress due to the difference between the light emitting elements 3 and the base member 1 in the thermal expansion rate, and improve the heat dissipation property. Employing a light reflecting member such as white-color resin as the underfill material, light output from the light emitting elements 3 toward a direction of the base member 1 can be reflected, and the luminous flux can be increased.

[Filling Member Forming Step]

The step of forming a filling member is an operation of providing the filling member 5b that covers the lateral surfaces of the light-transmissive member 4 between the frame body 5a and the light-transmissive member 4.

As shown in FIGS. 9A, 9B, and 9C, before curing the frame body 5a, the space inside the frame body 5a is filled with a light reflecting material (resin) that structures the filling member 5b. In the present embodiment, the filling member 5b covers the lateral surfaces of the light emitting elements 3 and those of the light-transmissive member 4. The upper surface of the light-transmissive member 4 exposed outside the filling member 5b serves as the light emitting surface 4a of the light emitting device 10. Further, the height of the upper surface (i.e., upper end) of the filling member 5b is set to be equal to or smaller than the height of the upper surface of the light-transmissive member 4.

The amount of the resin constituting the filling member 5b is adjusted to be enough to cover the lateral surfaces of the light emitting elements 3 and those of the light-transmissive member 4. While it depends on the surface state of the members or the viscosity of the resin, the height of the filling member 5b is, for example, half the height from the surface of the base member 1 or the electrically conductive patterns 2a and 2b to the light emitting surface 4a or greater. In order to prevent leakage of light, the filling member 5b preferably has a great thickness particularly at the lateral surfaces of the light emitting elements 3 which are the light emission sources. Accordingly, preferably the frame body 5a is formed to be at least higher than the upper surfaces of the light emitting elements 3, and the amount of the resin constituting the filling member 5b is adjusted such that the lowest portion in the surface of the filling member 5b becomes higher than the upper surfaces of the light emitting elements 3.

Further, in providing the resin constituting the filling member 5b, the space between the frame body 5a along the short side of the light-transmissive member 4 and the light-transmissive member 4 may be directly filled with the resin. However, filling the space between the frame body 5a along the long side of the light-transmissive member 4 and the light-transmissive member 4 with the resin allows the resin to run through the space between the frame body 5a along the short side of the light-transmissive member 4 and the light-transmissive member 4. This eliminates the necessity of elaborately filling the narrow space between the frame body 5a along the short side of the light-transmissive member 4 and the light-transmissive member 4 with the resin, simplifying the manufacture of the light emitting device 10.

Further, the protective element 7 is completely covered with the filling member 5b in order to prevent the protective element 7 from absorbing light. Here, preferably the frame body 5a and the filling member 5b cover the portions where the pair of positive and negative electrically conductive patterns 2a and 2b oppose to each other, such as near the light emitting elements 3 or near the protective element 7. This prevents short-circuiting due to dust attached thereto.

In order for the lateral surfaces of the light emitting elements 3 and those of the light-transmissive member 4 to be surely covered with the resin, the light reflecting material (resin) constituting the frame body 5a is preferably higher in the viscosity than the light reflecting material (resin) constituting the filling member 5b.

When the resin constituting the frame body 5a is higher in the viscosity than the resin constituting the filling member 5b, as compared to the case where the light reflecting member 5 is structured singularly by resin of high viscosity, the resin easily creeps up along the lateral surfaces of the light emitting elements 3 or those of the light-transmissive member 4. Accordingly, the lateral surfaces of the light emitting elements 3 and those of the light-transmissive member 4 can be covered with ease. Further, when the light reflecting member 5 is structured singularly by resin of low viscosity, the tail of the resin excessively spreads, whereby the light emitting device 10 is increased in size. Here, use of a mold for stopping the resin from excessively spreading, removal of the mold may pull the resin, and the resin may be separated from the base member 1. Accordingly, in the present embodiment, the frame body 5a is made of high viscosity resin, and the filling member 5b is made of low viscosity resin. Being made of resin higher in the viscosity than the resin constituting the filling member 5b, even before curing, the frame body 5a can function as a dam that blocks a flow of the low viscosity resin constituting the filling member 5b. The viscosity can be adjusted by, for example, the viscosity of the resin itself being the base material. In this case, the same light reflecting substance may be contained in the base material of the frame body 5a and in the base material of the filling member 5b.

(Light Reflecting Material Curing Step)

The step of curing a light reflecting material is an operation of curing the resin constituting the frame body 5a and the resin constituting the filling member 5b as shown in FIGS. 10A, 10B, and 10C, which is performed after the filling the space with the resin constituting the filling member 5b. Since the frame body 5a and the filling member 5b are formed on the identical base member 1 as being tightly bonded to each other, the resins can be cured in the same operation. Specifically, after providing the resin constituting the frame body 5a, the resin is tentatively cured; and after filling the space with the resin constituting the filling member 5b, the resin constituting the frame body 5a and the resin constituting the filling member 5b are fully cured together. As used herein, to tentatively cure means to cure the resin to the state where the resin keep its shape without flowing. Thus, the frame body 5a and the filling member 5b are rigidly bonded to each other, and so integrated with each other that the interface therebetween is hardly recognizable. This improves the adhesion force between the frame body 5a and the filling member 5b, and reduces separation of the frame body 5a and the filling member 5b from each other. Thus, the light emitting device 10 with improved reliability can be obtained. Preferably, in order for the resin constituting the frame body 5a and the resin constituting the filling member 5b to be cured under identical conditions, the resins as the base materials are substantially identical to each other in the curing conditions.

With the light emitting device 10 of the present embodiment, as described above, light leakage from the lateral surfaces of the light-transmissive member 4 less likely to occur, and exhibition of high front luminance can be realized. Additionally, with the reduced amount of the resin member which tends to deteriorate, the light reflecting member of the light emitting device 10 is less susceptible to deterioration.

In general, when a light reflecting member is repeatedly exposed to thermal shock, thermal stress may disadvantageously cause separation at the interface between the light reflecting member and members nearby, for example, at the interface between the light reflecting member and a base member, or at the interface between the light reflecting member and a light-transmissive member. However, in the light emitting device 10 of the present embodiment, the width of the light reflecting member 5 is smaller along the short side of the light-transmissive member 4 than along the long side of the light-transmissive member 4. This reduces the thermal stress at the interface between the light reflecting member 5 and the light-transmissive member 4, and the thermal stress at the interface between the light reflecting member 5 and the base member 1. Consequently, in the light emitting device 10 according to the present embodiment, separation at the interface between the light reflecting member 5 and the members nearby less likely to occur.

As to the shape of the light emitting device 10 according to the present embodiment, when the width of the light reflecting member 5 along the short side of the light-transmissive member 4 is the same as the width of the light reflecting member 5 along the long side of the light-transmissive member 4 (that is, being wide along both sides), the thermal stress at the interface between the light reflecting member 5 and the light-transmissive member 4 becomes greater. Further, when the width of the light reflecting member 5 along the long side of the light-transmissive member 4 is the same as the width of the light reflecting member 5 along the short side of the light-transmissive member 4 (that is, being narrow along both sides), the thermal stress at the interface between the light reflecting member 5 and the base member 1 becomes greater. Further, when the width of the light reflecting member 5 along the short side of the light-transmissive member 4 is greater than the width of the light reflecting member 5 along the long side of the light-transmissive member 4, the thermal stress at the interface between the light reflecting member 5 and the light-transmissive member 4, and the thermal stress at the interface between the light reflecting member 5 and the base member 1 become greater.

As described above, the light emitting device 10 according to the present embodiment and the method of manufacturing the same can attain the objective of providing a light emitting device including a light reflecting member that is less susceptible to deterioration and a method of manufacturing the same. Further, the light emitting device 10 according to the present embodiment and the method of manufacturing the same can attain the objective of providing a light emitting device in which separation at the interfaces between a light reflecting member and members nearby less likely to occurs and a method of manufacturing the same.

Further, since the light emitting device 10 according to the present embodiment requires a reduced amount of resin, the amount of gas that is released in curing the resin can be reduced. Thus, the risk of any organic material attaching to the product can be reduced.

The method of manufacturing the light emitting device 10 according to the present embodiment enables the frame body 5a to be formed in a simple manner through use of a discharging apparatus. This increases volume productivity of the light emitting device 10. Use of a small-diameter needle in forming the frame body 5a reduces outer dimensional tolerances of the corners of the frame body 5a. Further, use of a small-diameter needle in forming the frame body 5a can suppress the resin at the corners of the frame body 5a from spreading, and sharp corners of the frame body 5a can be formed. Use of a great-diameter needle in forming the frame body 5a provides four corners of the frame body 5a being rounded. On the other hand, use of a small-diameter needle allows the four corners of the frame body 5a to have right angles, and the outer dimension of the corners is more stabilized. A small-diameter needle refers to a needle of which inner diameter at the resin discharging port is 30 μm to 200 μm. In the method of manufacturing the light emitting device 10 according to the present embodiment, the frame body 5a is formed using a discharging apparatus having a small-diameter needle of which inner diameter is about 100 μm.

Since the method of manufacturing the light emitting device 10 according to the present embodiment provides the light reflecting member 5 with a small width not along every side, the space between the frame body 5a and the light-transmissive member 4 can be easily filled with resin.

In the foregoing, the light emitting device according to the present disclosure and the method of manufacturing the same have been specifically described based on the embodiment, the spirit of the present disclosure is not limited thereto and should be construed broadly based on the scope of claims. It goes without saying that the spirit of the present invention includes also variations and modifications based on the description.

For example, in the embodiment described above, the plate-like light-transmissive member 4 is bonded to the upper surfaces of the light emitting elements 3 and the lateral surfaces of the light emitting elements 3 are directly covered with the light reflecting member 5. However, the lateral surfaces of the light emitting elements 3 may be covered with the light-transmissive member 4. That is, the light-transmissive member 4 may cover the lateral surfaces of the light emitting elements 3 at the perimeter of the light-transmissive member 4, and the light reflecting member 5 may cover the lateral surfaces of the light-transmissive member 4 provided at the lateral surfaces of the light emitting elements 3.

In the embodiment described above, the lateral surfaces of the light-transmissive member 4 extend out from the portion at which the lateral surfaces of the light emitting elements 3 is located in a cross-sectional view. Alternatively, the lateral surfaces of the light-transmissive member 4 and the lateral surfaces of the light emitting elements 3 may be at the same position, and to be flush with each other. In this structure, the lateral surfaces of the light-transmissive member 4 and the lateral surfaces of the light emitting elements 3 are easily covered with the light reflecting member 5.

In the embodiment described above, the light-transmissive member 4 as a single light-transmissive member 4 is integrally provided at the upper surfaces of the three light emitting elements 3. Alternatively, light-transmissive members may be respectively joined to the light emitting elements 3, and the light-transmissive members may serve collectively as one substantially rectangular light-transmissive member in a plan view.

In the embodiment described above, the light-transmissive member 4 has a shape of a plate of which upper surface and lower surface are substantially in parallel to each other. Alternatively, the light-transmissive member 4 has surfaces with projections and recessions, or a curved surface. For example, the light-transmissive member 4 may be lens-shaped, and the lateral surfaces of the lens-shaped light-transmissive member 4 may be covered with the light reflecting member 5. This structure improves the light output efficiency.

In the embodiment described above, three light emitting elements 3 are mounted on the base member 1. However, the number of the light emitting elements 3 mounted is not limited thereto. At least one light emitting element 3 mounted suffices. The number may be changed as appropriate depending on the size of the desired light emitting device 10 and the required luminance. In the case where four or more light emitting elements 3 are mounted, they may be arranged in line, or may be arranged in array.

In the embodiment described above, the light emitting elements 3 are flip-chip mounted on the base member 1, however they may be face-up mounted.

In the embodiment described above, the frame body 5a is formed such that its outer edge is a rectangular frame shape with rounded corners in a plan view, however the frame body 5a may be rectangular with its four corners each forming a right angle in a plan view.

Still further, in the manufacturing method according to the embodiment described above, the forming a frame body, and thereafter the disposing an underfill material is performed. However, the forming a frame body may be performed after the disposing an underfill material so long as the underfill material can be disposed at the position within the area of the frame body 5a.

What is claimed is:

1. A light emitting device comprising:
   a base member;
   a light emitting element mounted on the base member;
   a light-transmissive member that covers an upper surface of the light emitting element, and is substantially rectangular in a plan view; and
   a light reflecting member that covers a lateral surface of the light-transmissive member, the light reflecting member having a substantially rectangular frame shape in a plan view,
   wherein a width of the light reflecting member is smaller along a short side of the light-transmissive member than along a long side of the light-transmissive member, and
   wherein a height of the light reflecting member is smaller along the short side of the light-transmissive member than along the long side of the light-transmissive member at a position separated from an outer edge of the light reflecting member by a predetermined distance.

2. A light emitting device comprising:
   a base member;
   a light emitting element mounted on the base member;
   a light-transmissive member that covers an upper surface of the light emitting element, and is substantially rectangular in a plan view; and
   a light reflecting member that includes a frame body that surrounds the light-transmissive member, and a filling member disposed between the frame body and the light-transmissive member so as to cover a lateral surface of the light-transmissive member, the light reflecting member having a substantially rectangular frame shape in a plan view,
   wherein a height of the frame body is smaller along a short side of the light-transmissive member than along a long side of the light-transmissive member.

3. The light emitting device according to claim 2, wherein the height of the frame body is greater than a height from an upper surface of the base member to the upper surface of the light emitting element, and smaller than a height from the upper surface of the base member to an upper surface of the light-transmissive member.

4. The light emitting device according to claim 2, wherein a width of the light reflecting member is smaller along the short side of the light-transmissive member than along the long side of the light-transmissive member in a plan view.

5. The light emitting device according to claim 2, wherein a height of an upper surface of the filling member is equal to or smaller than a height of an upper surface of the light-transmissive member from an upper surface of the base member.

6. The light emitting device according to claim 2, wherein a width of the frame body is smaller along the short side of the light-transmissive member than along the long side of the light-transmissive member.

7. The light emitting device according to claim 2, wherein, at a perimeter of the light-transmissive member, the light reflecting member covers a lateral surface of the light emitting element.

8. The light emitting device according to claim 2, wherein the light-transmissive member contains a fluorescent material.

9. The light emitting device according to claim 2, wherein the light-transmissive member has a plate-like shape.

10. The light emitting device according to claim 2 comprising a plurality of the light emitting elements.

* * * * *